США005378907A

United States Patent [19]

Melzner

[11] Patent Number: 5,378,907

[45] Date of Patent: Jan. 3, 1995

[54] COMPACT SEMICONDUCTOR STORAGE ARRANGEMENT AND METHOD FOR ITS PRODUCTION

[75] Inventor: Hanno Melzner, Grosshelfendorf, Germany

[73] Assignee: Siemens Aktiengesellschaft, Munich, Germany

[21] Appl. No.: 182,187

[22] PCT Filed: Jul. 20, 1992

[86] PCT No.: PCT/EP92/01653

§ 371 Date: Jan. 26, 1994

§ 102(e) Date: Jan. 26, 1994

[87] PCT Pub. No.: WO93/03501

PCT Pub. Date: Feb. 18, 1993

[30] Foreign Application Priority Data

Jul. 30, 1991 [DE] Germany .................. 4125199

[51] Int. Cl.[6] ............... H01L 29/68; H01L 29/78
[52] U.S. Cl. ..................... 257/301; 257/304; 257/390; 257/311; 437/47; 437/52; 437/60; 365/149
[58] Field of Search ............. 257/296, 301, 302, 303, 257/304, 305, 390, 311; 437/47, 51, 52, 48, 49; 365/149, 182

[56] References Cited

U.S. PATENT DOCUMENTS

| 4,894,696 | 1/1990 | Takeda et al. ............ 357/23.6 |
| 4,912,535 | 3/1990 | Okumura ................. 357/23.6 |
| 4,918,500 | 4/1990 | Inuishi .................. 357/23.6 |

FOREIGN PATENT DOCUMENTS

| 0176254 | 4/1986 | European Pat. Off. ..... 357/23.6 |
| 63-226058 | 9/1988 | Japan ................... 257/301 |
| 2-106958 | 4/1990 | Japan ................... 257/301 |
| 3-259567 | 11/1991 | Japan ................... 257/301 |

OTHER PUBLICATIONS

"Advanced Cell Structures for Dynamic RAMs", Nicky C. C. Lu, IEEE Circuits and Devices Magazine, vol. 5, No. 1, Jan. 1989, pp. 27-26.

"A High Density 4Mbit d RAM Process Using a Fully Overlapping Bitline Contact (FoBIC) Trench Cell", K. H. Kusters et al, Siemens—Symposium on VLSI Technology, 1987, pp. 93-94.

*Primary Examiner*—Jerome Jackson
*Assistant Examiner*—Donald L. Monin, Jr.
*Attorney, Agent, or Firm*—Hill, Steadman & Simpson

[57] ABSTRACT

The arrangement has storage cells consisting of MOS transistors and trench capacitors, the trench (7) being produced in a self-adjusted manner with respect to primary word lines (4) and insulation regions (2). Both capacitor electrodes are arranged within the trench, the first electrode being connected via a contact on the trench wall to the selection transistor. A bit line (20,21), which runs partially above and partially in the trench and is insulated from the second electrode (16) by a third and a fourth insulating layer (17,18) has a contact at this point to the conductive region of the adjacent selection transistor. The storage matrix is composed of rows of storage cells running in the direction of the bit line, the storage cells located in the same row having the selection transistor on a defined side of the capacitor, and on the opposite side in the adjacent row. A particularly high assessment reliability is achieved by two-layer metallization with a specific arrangement of primary, secondary and tertiary word lines (4', 40, 41).

16 Claims, 4 Drawing Sheets

COMPACT SEMICONDUCTOR STORAGE ARRANGEMENT AND METHOD FOR ITS PRODUCTION

BACKGROUND OF THE INVENTION

The invention relates to a semiconductor storage arrangement in a semiconductor substrate having storage cells, in each case consisting of a capacitor and an MOS selection transistor.

Semiconductor stores consist of a number of storage cells in a semiconductor substrate, consisting for example of silicon, which storage cells in each case comprise a capacitor for storing the information and a transistor for selecting the specific capacitor. In order to achieve a short access time and a small required area with a high memory capacity, the integration density of the arrangement must be increased, that is to say the space requirement of a cell must be minimized. However, it is not possible to reduce the size of all the structures of the cell in a linear manner since, for example, for reasons of electrical reliability the capacitor must not have less than a specific capacitance and structures of any desired fineness cannot be produced using the techniques which are available. Instead, a cell which is as small as possible for a given structure fineness must be achieved, that is to say the object is a cell which is as compact as possible. A measure for the extent to which a storage arrangement satisfies this object is the variable $c:=$cell area/(minimum structure size)2; $c$ should thus be as small as possible.

If $c$ is less than eight, the word lines and bit lines required to select a transistor then prevent further reduction of the size of the cell as long as only one cell is placed at each second crossing of a word line and bit line. This is the case in the so-called folded bit line scheme, which is used virtually without exception. In the case of values of $c$ less than eight, it is necessary to place a cell at each crossing of a word line and bit line (so-called open bit line concept). However, with this wiring, it is not possible to carry out a comparative measurement of two adjacent bit lines during reading from a cell, as in the case of the folded bit line scheme, so that, in storage arrangements according to the open bit line concept, the assessment reliability of open bit line storage arrangements is in general less.

In order to produce a cell which is as small as possible, European reference 0,176,254, for example, discloses the capacitor being arranged in a trench in the semiconductor substrate, both electrodes of the capacitor being accommodated in the trench, in the form of conductive layers, and being insulated from the semiconductor substrate. Such a storage cell becomes even more compact as a result of a side wall contact which is proposed in U.S. Pat. No. 4,918,500: The connection of the first capacitor electrodes to a conductive region of the selection transistor is not made on the surface of the semiconductor substrate but on the trench wall, in that a layer which covers the trench wall and insulates the first electrode from the semiconductor substrate is removed at a point in the vicinity of the trench upper edge. Further designs for very-large-scale-integrated semiconductor storage arrangements are discussed in the article by N. Lu in the IEEE Circuits and Devices Magazine, January 1989, pages 27 to 36.

SUMMARY OF THE INVENTION

The object of the present invention is to specify a semiconductor storage arrangement which solves the aforementioned problems.

The present invention is a semiconductor storage arrangement having word lines, bit lines and storage cells in a semiconductor substrate. Each storage cell has a capacitor, which is arranged predominantly in a trench, and an MOS selection transistor. A vertical trench contact is arranged between a first conductive region of the selection transistor and a first electrode of the capacitor, at a first point on the trench wall. The bit line runs at least partially in the trench. A vertical bit line contact is arranged at a second point on the trench wall, between the bit line and a second conductive region of the selection transistor of the adjacent storage cell.

In a further development of the present invention a first electrode, formed from a first electrode layer, and a second electrode, formed from a second electrode layer, of the capacitor are predominantly arranged in the trench. A first insulating layer, which essentially covers the trench surface consisting of the wall and the base, insulates the first electrode from the semiconductor substrate. A second insulating layer, which covers at least the first electrode, insulates the second electrode from the first electrode. The first conductive region of the selection transistor is connected to the first electrode, forming the trench contact, through a first opening in the first insulating layer at the first point on the trench wall. At least a third insulating layer insulates the second electrode from the bit line which is located above it and runs partially in the trench. A second opening in the first and second electrode layers, respectively and in the first and second insulating layer, respectively, are located at the second point on the trench wall in such a manner that the bit line which runs at this point in the trench through the second openings has the bit line contact with the second conductive region of the selection transistor on the adjacent storage cell.

In a further development of the present invention the trench of the storage cell is arranged in a self-adjusted manner with respect to a gate of the selection transistor, with respect to the gate of the selection transistor of the adjacent storage cell and with respect to an insulation region which insulates different storage cells.

In a further development of the present invention the first electrode covers at least the first opening and the majority of the first insulating layer on the trench wall and on the trench base.

In a further development of the present invention the first electrode layer has a second opening which is essentially superimposed on the other second openings but extends at a greater depth in the trench.

In a further development of the present invention the first insulating layer is a double layer consisting of silicon oxide and silicon nitride located above it.

In a further development of the present invention the bit line contact is arranged at a point on the trench wall located opposite the trench contact.

In a further development of the present invention a fourth insulating layer is provided, which insulates the part of the bit line running outside the trench from the second electrode.

In a further development of the present invention a fourth insulating layer is provided, which is produced by paralytic decomposition of tetra-ethyl orthosilicate (TEOS), and by a third insulating layer, which consists of polysilicon oxide.

The method of the present invention for producing the semiconductor storage has the following steps:

a) Production of essentially strip-shaped insulation regions for insulating various storage cells from one another, b) Production of a primary word line with the gate of the selection transistor, c) Production of a trench for holding the capacitor in a self-adjusted manner with respect to the insulation region, to the gate and to the gate of an adjacent selection transistor, d) Production of a first insulating layer on the trench wall and the trench base, having a first opening in the first insulating layer at the first point on the trench wall, e) Production of a first electrode by the application of a first electrode layer on the first insulating layer and on the part of the trench wall exposed by the first opening, and production of a second opening in the first electrode layer at the second point on the trench wall, f) Production of a second insulating layer at least on the first electrode, g) Filling of the trench with a second electrode layer, h) Production of a second electrode out of the second electrode layer by production of a second opening in the second electrode layer, which at least partially covers the second opening in the first electrode layer, i) Production of at least one third insulating layer on the exposed surface of the second electrode, j) Removal of the layers which exist at the second point on the trench wall, k) Production of a bit line, which runs partially above and partially in the trench and, at the second point on the trench wall, has a bit line contact for the second conductive region of the selection transistor of the adjacent storage cell.

In a further development of the present invention the first electrode layer is produced by depositing polysilicon over the entire area and an anisotropic etching back, the trench being filled with photoresist to above the step which is formed on the trench contact in the first conductive layer.

In a further development of the present invention the trench is filled with the second electrode layer, said layer is covered with a fourth insulating layer.

In a further development of the present invention the fourth insulating layer is structured using a photographic technique such that the second opening is subsequently etched into the second electrode layer using it as a mask.

The present invention is also of a semiconductor storage arrangement, the storage cells being arranged as follows: the storage cells are arranged in rows in a first direction which runs parallel to the geometrical connection line between the selection transistor and the capacitor, the rows being separated from one another by the insulation regions; the storage cells which are located in the same row have the selection transistor on a defined side of the capacitor; the associated selection transistor in the adjacent row is arranged on the opposite side of the capacitor; the selection transistors are arranged in a row in a second direction running at right angles to the first; and the trenches are arranged in a row in the second direction.

The present invention is also a semiconductor storage arrangement which according to an open bit-line concept has the following features: secondary and tertiary word lines are arranged in two superimposed metallization planes, which word lines respectively run alternatively in the first and in the second metallization plane. In each case one secondary and one tertiary word line are arranged essentially one above the other in the first and second metallization plane, and above a primary word line, and are passed by one another without crossing when they alternate into the respectively other metallization plane. The primary word line is divided into sections, each section being connected via a contact to the word line running above it in the first metallization plane. In a region around the crossing-free alternation, the secondary and the tertiary word lines, both run to a very large extent in one of the two metallization planes, and a selection line is arranged in the other metallization plane.

The invention is based on:

a self-adjusted technique for producing the capacitor trench, as a result of which the otherwise normal separations between the trench and transistor and between the trench and the lateral insulation is omitted, a vertical contact between the bit line and a conductive region of the selection transistor, which is arranged on the trench wall, a specific arrangement of the word lines using primary, secondary and tertiary word lines, as a result of which an assessment reliability is achieved which is comparable to the folded bit line scheme.

The proposed cell has the value $c=6$ and offers optimum preconditions for a further reduction in size. It can be used for very-large-scale-integrated semiconductor stores, such as the 64M-DRAM.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, in the several Figures of which like reference numerals identify like elements, and in which:

DESCRIPTION OF THE PREFERRED EMBODIMENT

Figure 1:
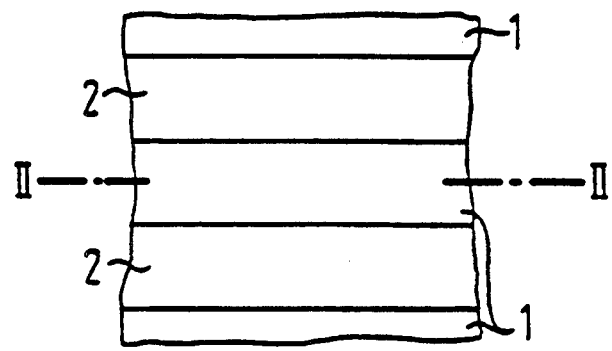
FIG. 1 shows a plan view.

FIG. 1: Insulation regions 2, which run essentially in the form of strips and are used for lateral insulation of the storage cells which are to be produced between these insulation regions 2, are produced in a semiconductor substrate 1. The insulation regions 2 are preferably produced as entrenched oxide regions, for example according to the method described in the article by C. Zeller, F. Stelz, Conference Volume ESSDERC 89, pages 135–138, so that they have essentially vertical edges with a depth of approximately 600 nm, and their surfaces lie in a plane with the surface of the semiconductor substrate 1.

Figure 2:
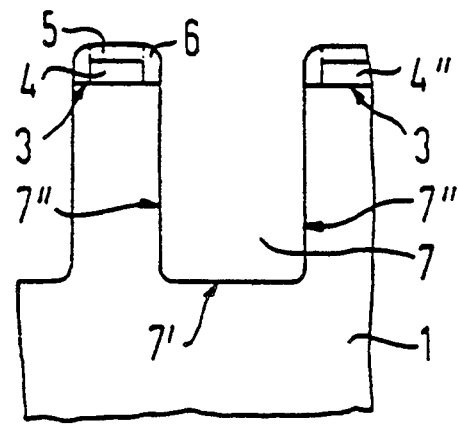
FIG. 2 to 7 show a schematic representation of a cross-section through a semiconductor substrate in the region of storage cells, on which the steps of an embodiment of the method are indicated, the section running along the line II—II in FIG. 1.

FIG. 2: A gate oxide (not shown) is produced on the entire surface 3 of the semiconductor substrate, a layer to form a gate 4 of the selection transistor and to form a primary word line (4') subsequently being deposited over the entire area, for example doped polysilicon with a thickness of approximately 250 nm. An insulation layer 5 is deposited thereon, preferably by pyrolitic decomposition of tetra-ethyl orthosilicate (TEOS) (designated TEOS layer 5 in the following text), and is structured using a photographic technique to form a web. Using the structured TEOS layer 5 as a mask, the polysilicon layer is structured such that a primary word line (4') is produced running approximately at right angles to the strip-shaped insulation regions 2; in this arrangement, a part running over the semiconductor substrate 1 at the same time represents the gate 4. An etching process having a sufficiently high selectivity for the gate oxide and for the entrenched oxide 2 is used. The primary word line and the gate 4 are encapsulated laterally with spacers 6, for insulation, which are normally produced by a further TEOS deposition of approximately 100 nm and an anisotropic etching-back process; the surface of the word line and gate 4 is already covered with TEOS 5.

Conductive regions (source and drain) of the transistors are now implanted using further photographic techniques, especially regions of the transistors at the periphery of the circuit. The conductive regions of the selection transistor can also be produced in a later method step.

Processes which are normal in semiconductor technology can be used for the method steps described above. Thus, for example, it is known for the width of the TEOS web 5 to be reduced below the limit set by the photographic technique, by wet etching before structuring the polysilicon layer, in order to achieve a short gate length. An oxidation step in order to round the lower gate edges is also normal.

The invention now provides for a capacitor trench 7 to be produced in the semiconductor substrate 1 in a self-adjusted manner with respect to the already produced structures, that is to say with respect to the insulation regions 2 and with respect to the primary word lines and gates 4 (an adjacent gate is designated by 4") which are encapsulated with the TEOS layer 5 and the spacers 6. An anisotropic etching process is used which etches the material of the said structures, namely silicon dioxide and TEOS, to an adequate extent more slowly than the exposed semiconductor substrate 1. The TEOS layer 5 and the spacers 6 must still provide adequate insulation after the etching process. The trench 7, produced in this way, for holding the capacitor has an essentially rectangular cross-section.

Figure 3:
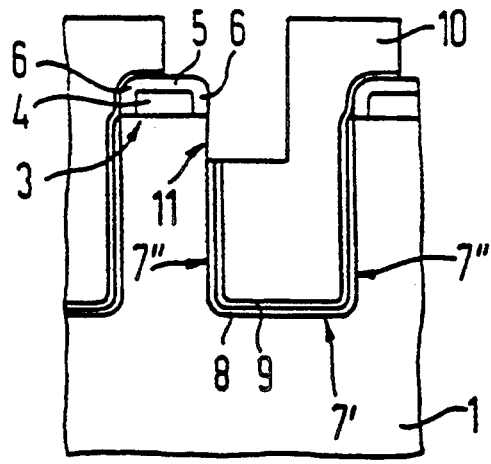

FIG. 3: A first insulating layer 8,9, for insulation with respect to the semiconductor substrate 1, is applied to the surface of the trench 7, which consists of a base 7' and a wall 7", which is essentially at right angles to the semiconductor substrate surface 3. In this exemplary embodiment, the first insulating layer consists of a double layer, having a silicon oxide layer 8, which is approximately 20 nm thick, and a silicon nitride layer 9, which is deposited over the entire surface and is approximately 30 nm thick, as components. A structured photoresist layer 10 exposes one side of the trench wall 7" in the vicinity of the upper edge of the trench to a specific depth, which can be adjusted during structuring via the exposure time. At least the opposite side of the trench wall 7" and the base are covered with photoresist 10. The first insulating layer 8,9 is removed at the exposed point so that a first opening in the first insulating layer 8, 9 is formed; in this case, the TEOS 5,6 of the gate encapsulation may be attacked only slightly. The point of the semiconductor substrate 1 which is now exposed in the upper region of the trench wall 7" permits subsequent contact between a capacitor electrode and a conductive region of the selection transistor, and represents the so-called trench contact 11. Said contact defines the selection transistor which is associated with the trench 7 and is shown on the left-hand side of the trench in FIG. 3.

Figure 4:
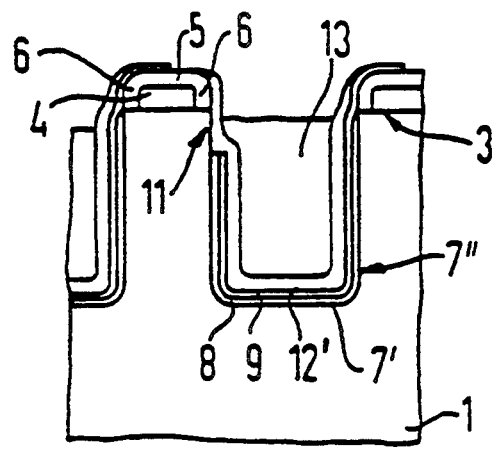

FIG. 4: The structured photoresist layer 10 is removed. A first electrode layer 12' is produced in order to form a first electrode 12 of the capacitor. An approximately 30 nm thick doped polysilicon layer, for example, can be deposited for this purpose, which is subsequently removed by anisotropic etching back at least above the TEOS web 5. This results in the production of the first electrode layer 12', from which the first electrode 12 is subsequently formed. During the etching back, the trench 7 may be partially filled with a photoresist plug 13 which covers the step, which is produced by the first insulating layer 8,9 underneath it, in the first electrode 12' on the trench contact 11. In consequence, the first electrode layer 12' on this step is not attacked and, in addition, also covers the trench base 7'. The photoresist plug 13 can be incorporated in the trench for example by means of a rear exposure of the photoresist (that is to say exposure and development of the entire area); it is removed after the etching back. The first electrode layer 12' produced in this way is still connected to the first electrode layer in an adjacent trench in the direction of the primary word line (4'), to be precise via the part of the first electrode layer 12' located above the substrate surface 3, on the sides of the TEOS spacer 6.

Figure 5:
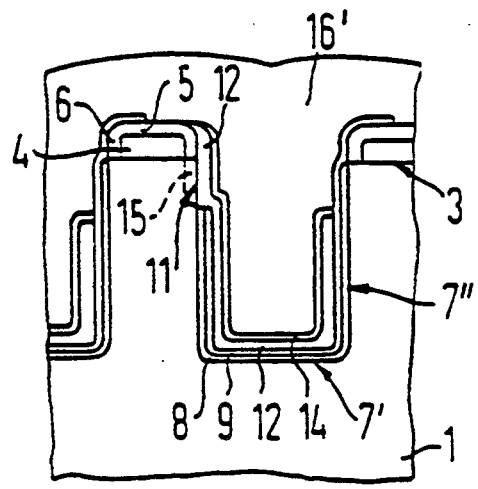

FIG. 5: The first electrode layer 12' is structured using a photographic technique such that a first electrode 12 is located in each trench. This can be carried out easily because of the storage matrix according to the invention: The photographic technique (not shown) defines a second opening on the side of the trench wall 7" opposite the first opening (to the trench contact 11), in the vicinity of the upper edge of the trench. The first electrode layer 12' is selectively removed at this point to the first insulating layer 8,9 underneath it, and thus has the second opening. The side of the trench wall 7" on which the first opening is arranged is covered with photoresist during this process step. In order to ensure separation from the said adjacent first electrodes, the second opening in the word line direction must have at least the dimensions (32) shown in FIG. 8, that is to say must cover the entire trench on both sides up to the insulation regions 2; in the direction at right angles thereto, the complete removal of the first electrode layer 12' above the substrate surface 3, and also in the vicinity of the upper edge of the trench, must be ensured. Because of limiting conditions related to the method, especially the resolution capability and the adjustment error during the photographic technique, the region designated by 32 in FIG. 8 must generally be selected to be larger. The second opening in the first electrode layer 12' advantageously extends to a depth of approximately 500 nm underneath the substrate surface 3, it being possible to control this in the same way as during the production of the first opening.

After removal of the said photoresist layer, a second insulating layer 14, for example a so-called ONO layer, is produced at least on the first electrode 12 as a capacitor dielectric. As a result of the high temperatures which occur in this case, doping materials diffuse out from the first electrode 12 through the first opening, that is to say via the trench contact 11 into the semiconductor substrate 1, so that a conductive region 15 of the selection transistor is produced there. Subsequently, a second electrode 16' is incorporated in the trench in order to form a second electrode 16; in this case, the entire trench 7 is normally filled using a thick doped polysilicon layer which is then etched back somewhat. At the same time, the regions between the primary word lines are filled via the insulation regions 2.

Figure 6:
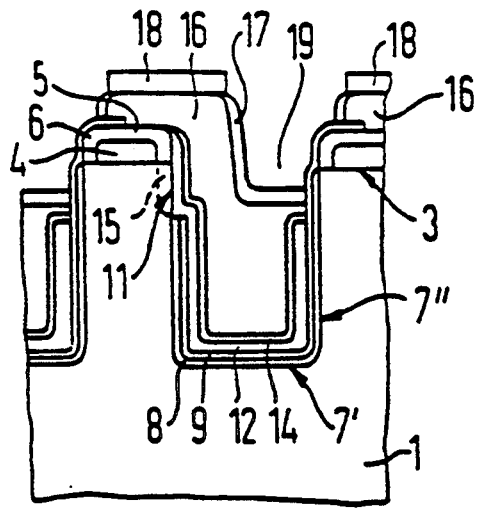

FIG. 6: The surface which is now present and is largely levelled is covered with a further (fourth) insulating layer 18, an approximately 200 nm thick TEOS layer being deposited for this purpose. The TEOS layer 18 is structured such that it is suitable as a mask for the production of a bit line contact: the trench wall, together with the trench contact 11, is covered by the TEOS layer 18, while the second electrode layer 16' is at least partially exposed on the side of the trench which has the second opening in the first electrode layer 12'. A second electrode 16 is now produced from the second electrode layer 16', in that a bit line contact hole 19 is anisotropically etched to a depth which lies below the substrate surface 3 and preferably above the upper edge of the first electrode 12 at this point, as can be seen in FIG. 6. The second electrode layer 16' thus has a second opening, in the same way as the first electrode layer, which is essentially located at the same point on the trench wall 7" and extends to a shallower depth in the trench. The silicon nitride 9 is now exposed at this point on the trench wall 7".

A third insulation layer 17 is produced on the exposed surface of the second electrode 16, preferably by an oxidation process. The thickness of the silicon oxide layer 17 formed in this way is approximately 80 nm. The exposed nitride 9 protects this point of the trench wall, the subsequent bit line contact, against oxidation.

Figure 7:
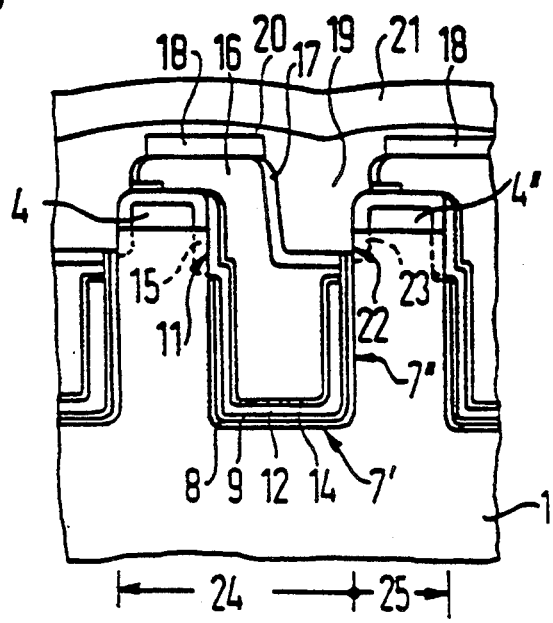

FIG. 7: In addition to the storage cell 24 under discussion, the figure also shows the selection transistor 25 of the storage cell which is adjacent on the right. The silicon nitride 9 which is exposed on the trench wall 7" in the region of the second opening, and the silicon oxide 8 underneath it are removed, for example by wet-etching processes, so that a second opening is produced in the first insulating layer 8,9, which is located at the same point as the second opening in the second electrode layer 16'. The original trench wall 7" is now exposed at this point. The first insulating layer 8,9 thus has the first and the second opening, while the second insulating layer 14 and both electrode layers in each case have only the second opening. The second opening in the first electrode layer 12' in general extends to a greater depth in the trench (that is to say the upper edge of the first electrode 12 is deeper) than the other second openings, so that the capacitor dielectric 14 cannot be attacked during the last-mentioned wet-etching process. This condition may be omitted if the etching process by means of which the second opening is produced in the first insulating layer 8,9 to the material of the dielectric 14 is highly selective. The bit line 20,21 is produced subsequently, a bit line contact 22 being formed in the region of the second opening. Normally, an approximately 500 nm thick polysilicon layer 20 is initially deposited over the entire area and is etched back to approximately 100 nm, as a result of which the bit line hole 19 is already largely filled. Molybdenum silicon 21, for example, is applied on top of this as a suitable bit line material and is structured, together with the polysilicon layer 20, to form a bit line. The bit line 20,21 then runs via the trench, or, in the region of the bit line contact hole 19, partially in the trench 7. As a result of outward diffusion from the bit line 20,21 via the bit line contact 22, for example during subsequent tempering in order to silicon-coat the molybdenum, a second conductive region 23 is formed. The bit line contact 22 now exists in the region of the second opening between the bit line 20,21 and the second conductive region 23 (for example the drain) of the selection transistor of the adjacent (in the figure on the right) storage cell. The bit line contact of a storage cell is thus always arranged in the trench or on the trench wall of a storage cell which is adjacent in the bit line direction (on the left in this case).

The third and fourth insulating layers 17,18 represent the insulation of the second electrode 16 with respect to the bit line 20,21. Instead of this, it is also possible to produce the bit line hole 19 and the second opening in the second electrode layer 16' directly, using a photographic technique, without using a fourth insulating layer 18, and, after removing the photoresist, to oxidize the entire surface or to produce a continuous third insulating layer 17 in a different way. However, the additional use of a fourth insulating layer 18, consisting of TEOS, has the advantage of a better insulation effect, furthermore the requirements for the photographic technique can be less stringent since the bit line contact hole 19 can be further reduced by the possible formation of TEOS spacers. Finally, a greater deposition of the layer 18 may in consequence be accepted during the structuring of the bit line.

Figure 8:
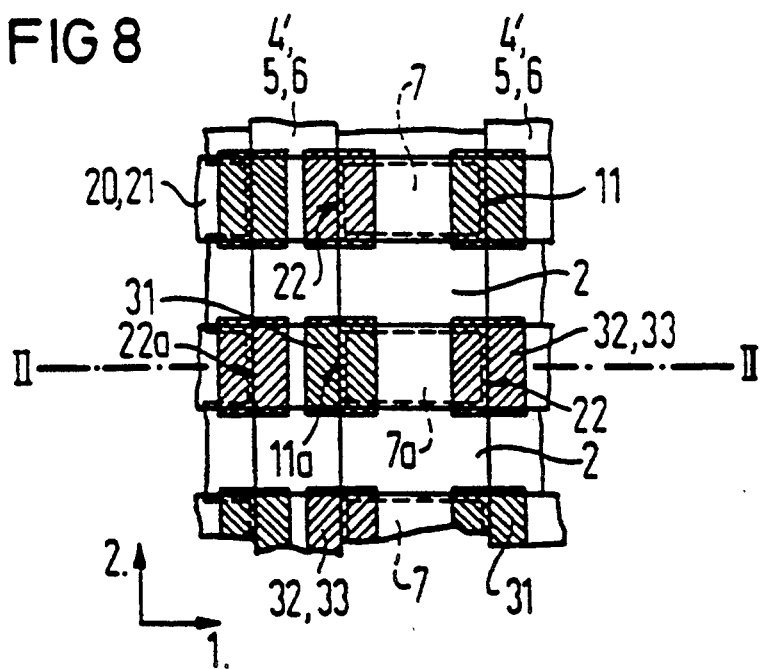
FIG. 8 shows a plan view of the storage matrix with an advantageous arrangement of the storage cells.

FIG. 8: The plan view of the storage matrix shows schematically the position of the storage cells in rows between the strip-shaped insulation regions 2. The primary word lines 4', which are encapsulated by means of TEOS 5,6, run at right angles to the bit lines 20,21. The grid formed by the insulation regions 2 and the TEOS cover 5,6 represents the mask for the self-adjusted production of the trenches 7.

On the one side, the trench 7 of a storage cell has the trench contact 11 to the source region of its selection transistor, the bit line contact between the selection transistor of the adjacent storage cell and the bit line 20,21 being arranged on the opposite side. The trench, trench contact and bit line contact associated with the storage cell in the center are designated by 7a, 11a and 22a.

Three lithography planes are also indicated schematically:

The first insulating layer 8,9 is etched using a photoresist layer which does not cover at least the regions designated by 31 (cf. FIG. 3, photoresist layer 10), so that the first opening for the production of the trench contact 11 is produced at the first point on the trench wall.

The first electrode layer 12' is etched using a further photoresist layer, which does not cover at least the regions designated by 32 (production of the second opening in the first electrode layer 12'), so that a first electrode, which is isolated from the others, is located in each trench 7 (cf. FIGS. 4 and 5). The regions 32 must extend in each case at least up to the insulation strips 2 in the direction of the word lines 4'.

The bit line contact hole 19 is produced by etching of the fourth insulating layer 18 using a further photoresist layer which does not cover at least the regions designated by 33 (cf. FIG. 6), as a result of which the second opening is produced in the second electrode layer 16' and in the first insulating layer 8,9, and the bit line contact 22 is produced at the second point on the trench wall, in subsequent steps.

The openings 32 and 33 may be superimposed, as indicated in FIG. 8, their overlap having to permit at least the production of an adequate bit line contact. The regions 31,32,33 may be selected in a different form, especially larger, than indicated in the figure. They may also be partially superimposed. In general, the openings in the photoresist layers must be selected larger, in order to take into account adjustment errors, and the resolution capability inter alia. It is advantageous if the regions 31 and/or 32 and/or 33 in each case still cover half the insulation regions 2 in the second direction, towards both sides. The extent in the first direction is generally determined by the resolution capability; region 32 in particular may, however, also be selected for reliability reasons such that it covers up to approximately half the trench 7.

FIG. 8 also shows the arrangement according To the invention of the storage cells in a storage matrix:

The storage cells are arranged in rows which run parallel to the bit lines 20,21 (first direction) and are separated from one another by the strip-shaped insulation regions 2. In the case of all the storage cells in the same row, the selection transistor is arranged on the same side of the associated capacitor, for example in the row designated by A—A, all the selection transistors are located on the left-hand side of the associated capacitor. Such a row is also shown, in cross-section, in FIGS. 2 to 7. The trench contact 11 is accordingly located on the left-hand upper edge of the trench, the bit line contact 22 of the adjacent storage cell being located on the right-hand upper edge of the trench. This orientation is reversed in an adjacent row of storage cells: All the selection transistors are located on the right-hand side of the associated capacitor, the trench contact 11 and bit line contact 22 correspondingly being interchanged. In the direction of the word lines 4' (second direction), all the selection transistors are located in a row, likewise all the trenches 7.

This storage matrix is particularly advantageous for achieving a cell which is as compact as possible. It places only non-stringent requirements on the photographic technique used, it is easily possible to separate the first electrodes in the various trenches from one another. A storage cell is created at each crossing of a word line and bit line. Typical values for the size of such a storage cell are:

Word line grid: 2.1 $\mu$m, word line width: 0.7 $\mu$m

Bit line grid: 1.4 $\mu$m, bit line width: 0.7 $\mu$m

Capacitor trench: 1.4 $\mu$m×0.7 $\mu$m, trench depth: 3 $\mu$m,

Cell area: 2.94 $\mu m^2$, c=6.

An advantage of the method according to the invention is its simple capability for integration with other normal methods for the production of very-large-scale-integrated circuits. For example, in the case of transistors in the periphery, the bit line contact can be produced according to the "FOBIC" concept if, after the implantation of the peripheral transistors in the periphery, a thin nitride layer is produced and an interfusing intermediate oxide is produced thereon (see Küsters et al., Proc. of the 1987 Symposium on VLSI Technology, Nagano, Japan, pages 93-94). After the production of the third insulating layer, a hole is then etched into the intermediate oxide, in the periphery above the transistor with which contact is to be made, down to the thin nitride layer underneath said intermediate oxide. The bit line contact can be opened in the periphery by removal of the thin nitride layer at the same time as the production of the bit line contact in the storage field (removal of the first insulating layer 8,9 of the bit line contact 22).

Figure 9:
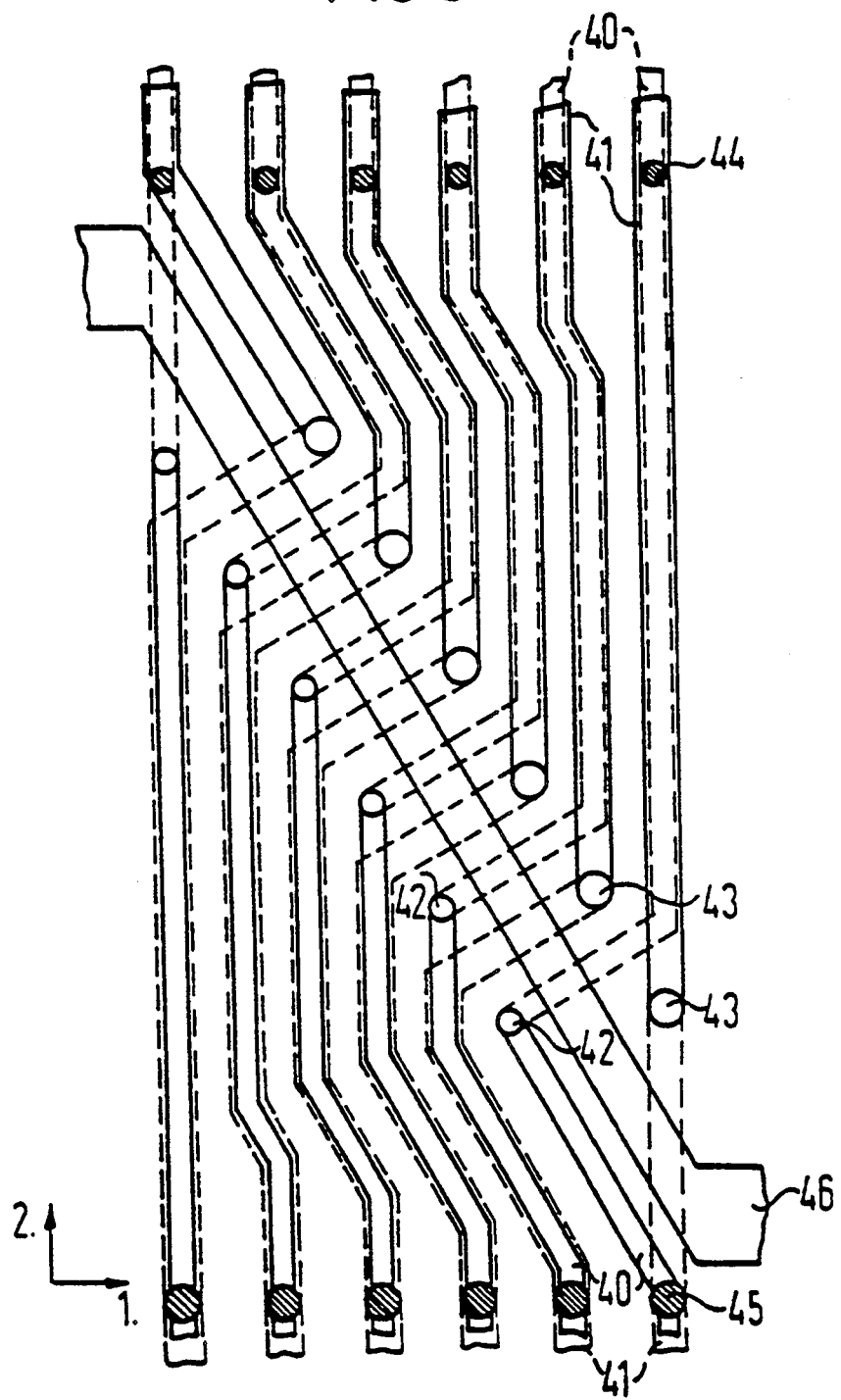
FIG. 9 shows a plan view of the storage arrangement with an advantageous is arrangement of word lines.

FIG. 9: In order to increase the assessment reliability in the open bit-line concept, apart from the primary word lines 4' consisting of polysilicon which have already been explained, secondary word lines 40 and tertiary word lines 41 are provided, which are arranged in superimposed metallization planes. For reasons of clarity, the second word line 40 is shown narrower than the tertiary word line 41.

As a result of a specific arrangement, which is explained in the following text, and a specific wiring concept of the primary, secondary and tertiary word line 4',40,41 wiring of the storage cells is achieved which is similar to the folded bit line scheme: The secondary word line 40 and the tertiary word line 41 run alternately in a first and a second metallization plane above it, being twisted: For example, the secondary word line 40 runs for a length X in the first metallization plane (shown by dashed lines in the Figure), is then raised above a so-called via 42 into the second metallization plane, runs for a path which is in general of the same length in the second metallization plane (continuous line) and is then passed back into the first metallization plane again, via a further via. The tertiary word line 41 runs in a complementary manner to the secondary word line, that is to say essentially parallel to it and in the other metallization plane in each case except for the region around the vias; it is passed from the second metallization plane into the first metallization plane via a via 43. With respect to the vias 42,43, care must be taken to ensure that the word lines alternate into the other plane in each case without crossing, which is achieved in the case of the arrangement of vias and word lines specified in FIG. 9 and leads to the twisting of the secondary and tertiary word line 40,41. Thus, the secondary word line 40 and the tertiary word line 41 are located in the first metallization plane alternately, in each case for the length X.

The primary word line 4' (not shown) is not continuous in the polysilicon layer, but rests on it in sections which run in each case, for example, over 16 cells. A contact 44,45 to the superimposed first metallization plane, that is to say either to the secondary word line 40 or the tertiary word line 41, is preferably located in the center of such a section. The primary word line (and its sections) runs between two such contacts 44,45, preferably in a straight line. The crossing-free alternation of the secondary and tertiary word lines into the other metallization plane in each case is arranged between the contacts 44,45 of two primary word line sections (in the superimposed metallization planes) which are adjacent in the word line direction, so that, of two primary word line sections which are adjacent in the word line direction, the one is connected to the secondary word line 40 via the contact 44, the other being connected to the tertiary word line 41 via the contact 45. The length s is thus contiguous with the length of the primary word line sections, these two sizes being approximately equal in the most simple case. For reasons of clarity, the vias and contacts corresponding to the word lines are shown in a different size.

If the secondary word line 40 or the tertiary word line 41 is now triggered, then only one such section of the primary word line is triggered, via which this word line runs in the first metallization plane; in this way, the 16 cells which are located in this section are now read. The adjacent 16 cells are not triggered. A bit line of the triggered section is compared with a bit line of the adjacent section for assessment of the signal. Thus, as distinct from the normal case, the next or next-but-one bit line in each case is not used as the reference bit line during reading of a cell, but the sixteenth in each case in this exemplary embodiment. An interconnection of these bit lines, for example via metal links, is required at the read amplifiers.

The contact 44,45 between the primary word line and the secondary word line, and the via 42,43 during alternation of a secondary or tertiary word line into the other metallization plane is intended to occupy as little space as possible. Thus, those embodiments are advantageous in which the lines which are to be electrically connected to the connecting point are not broadened; such connections are designated as being non-nested/non-capped when neither of the two lines is broadened. Such connections can be implemented, for example, by contact holes filled with tungsten between the primary and secondary word line and by vias filled with tungsten between the secondary and tertiary word line. A contact 44 between the primary and secondary word line is preferably arranged above an insulation region 2 (cf. FIG. 8) and not above the selection transistor; to this end, it may be necessary for the strip of the insulating region 2 located under a contact 44 to have a greater width, for example 1.6 $\mu$m in the case of the above-mentioned grids and structure sizes, than the strips of the insulation region 2 above which no contact 44 is arranged. Likewise, it may be necessary at the separating points between two sections of the primary word line to broaden the strip of the insulation region 2 located underneath, for example to 1.2 $\mu$m.

The space which is required for a via 42,43, that is to say for the alternation of the secondary or tertiary word line into the other metallization plane in each case, determines how short the sections of the primary word line may be, and hence how far the bit lines to be compared are spaced apart. In order to reduce the number of bit decoders required, it is advantageous to provide an additional selection line 46 (so-called column-select line) in the semiconductor storage arrangement, which is connected to a central pre-decoder and to a read amplifier. The selection line 46 may be arranged in the second metallization plane, if the specific arrangement, shown in FIG. 9, of the secondary and tertiary word lines 40,41, of the contacts 44,45 and of the vias 42,43 is selected for a length of the primary word line sections of 16 cells. It is in general, for example in the case of the specified dimensionings, not necessary for this purpose for the separation of the contacts 44 in the bit line direction (first direction) to be increased, this separation being defined by the specified dimensions of the trench 7. Depending on the circuit concept, the use of the lines running in the bit line direction may also be used for another purpose, not only as selection lines in the above sense.

The invention is not limited to the particular details of the apparatus and method depicted and other modifications and applications are contemplated. Certain other changes may be made in the above described apparatus and method without departing from the true spirit and scope of the invention herein involved. It is intended, therefore, that the subject matter in the above depiction shall be interpreted as illustrative and not in a limiting sense.

what is claimed is:

1. A semiconductor storage arrangement comprising: word lines, bit lines and storage cells in a semiconductor substrate,
   each storage cell having a capacitor, which is arranged substantially in a trench, and an MOS selection transistor,
   a vertical trench contact being arranged between a first conductive region of the selection transistor and a first electrode of the capacitor, at a first point on a trench wall of the trench,
   a respective bit line running at least partially in the trench, and
   a vertical bit line contact arranged at a second point on the trench wall, between the respective bit line and a second conductive region of a further selection transistor of an adjacent storage cell.

2. The semiconductor storage arrangement according to claim 1,
   wherein a first electrode, formed from a first electrode layer, and a second electrode, formed from a second electrode layer, of the capacitor are substantially arranged in the trench,
   wherein a first insulating layer, which substantially covers a trench surface consisting of the trench wall and a trench base, and insulates the first electrode from the semiconductor substrate,
   wherein a second insulating layer, which covers at least the first electrode, insulates the second electrode from the first electrode,
   wherein the first conductive region of the selection transistor is connected to the first electrode, forming the trench contact, through a first opening in the first insulating layer at the first point on the trench wall,
   wherein at least a third insulating layer insulates the second electrode from the respective bit line which is located above it and runs partially in the trench, and
   wherein a second opening in the first and second electrode layers respectively and in the first and second insulating layer respectively are located at the second point on the trench wall such that the respective bit line which runs at this point in the trench through the second openings has the bit line contact with the second conductive region of the further selection transistor on the adjacent storage cell.

3. The semiconductor storage arrangement according to claim 2, wherein the trench of the storage cell is arranged in a self-adjusted manner with respect to a gate of the selection transistor, with respect to a gate of the further selection transistor of the adjacent storage cell and with respect to an insulation region which insulates different storage cells.

4. The semiconductor storage arrangement according to claim 2, wherein the first electrode covers at least the first opening and the majority of the first insulating layer on the trench wall and on the trench base.

5. The semiconductor storage arrangement according to claim 2, wherein the first electrode layer has a second opening which is essentially superimposed on the other second openings but extends to a greater depth in the trench.

6. The semiconductor storage arrangement according to claim 2, wherein the first insulating layer is a double layer consisting of silicon oxide and silicon nitride located thereabove.

7. The semiconductor storage arrangement according to claim 1, wherein the bit line contact is arranged at a point on the trench wall located opposite the trench contact.

8. The semiconductor storage arrangement according to claim 1, wherein the arrangement further comprises a fourth insulating layer, which insulates a part of the respective bit line that runs outside the trench from the second electrode.

9. The semiconductor storage arrangement according to claim 1, wherein the arrangement further comprises a fourth insulating layer, which is produced by paralytic decomposition of tetra-ethyl orthosilicate, and by a third insulating layer, which consists of polysilicon oxide.

10. A method for producing a semiconductor storage arrangement having word lines, bit lines and storage cells in a semiconductor substrate, each storage cell having a capacitor, which is arranged substantially in a trench having a trench wall and a trench base, and having an MOS selection transistor, a vertical trench contact being arranged between a first conductive region of the selection transistor and a first electrode of the capacitor, at a first point on the trench wall, a respective bit line running at least partially in the trench, and a vertical bit line contact arranged at a second point on the trench wall between the respected bit line and a second conductive region of a further selection transistor of the adjacent storage cell, comprising the steps of:
producing substantially strip-shaped insulation regions for insulating various storage cells from one another,
producing a primary word line with the gate of the selection transistor,
producing a trench for holding the capacitor in a self-adjusted manner with respect to the insulation region, to the gate and to a gate of an adjacent selection transistor,
producing a first insulating layer on the trench wall and the trench base, having a first opening in the first insulating layer at the first point on the trench wall,
producing a first electrode by application of a first electrode layer on the first insulating layer and on a part of the trench wall exposed by the first opening, and producing a second opening in the first electrode layer at the second point on the trench wall,
producing a second insulating layer at least on the first electrode,
filling the trench with a second electrode layer,
producing a second electrode out of the second electrode layer by production of a second opening in the second electrode layer, which at least partially covers the second opening in the first electrode layer,
producing at least one third insulating layer on the exposed surface of the second electrode,
removing the layers which exist at the second point on the trench wall,
producing a bit line, which runs partially above and partially in the trench and, at the second point on the trench wall, has a bit line contact for the second conductive region of the further selection transistor of the adjacent storage cell.

11. The method according to claim 10, wherein the first electrode layer is produced by depositing polysilicon over the entire area and an anisotropic etching back, the trench being filled with photoresist to above a step which is formed on the trench contact in the first conductive layer.

12. The method according to claim 10, wherein after the trench is filled with the second electrode layer, said second electrode layer is covered with a fourth insulating layer.

13. The method according to claim 12, wherein the fourth insulating layer is structured using a photographic technique such that the second opening is subsequently etched into the second electrode layer using it as a mask.

14. A storage matrix having at least four storage cells of a semiconductor storage arrangement according to claim 1, wherein the storage cells are arranged as follows:
the storage cells are arranged in rows in a first direction which runs parallel to a geometrical connection line between the selection transistor and the capacitor, the rows being separated from one another by the insulation regions,
the storage cells which are located in the same row have the selection transistor on a defined side of the capacitor,
an associated selection transistor in an adjacent row is arranged on an opposite side of the capacitor,
the selection transistors are arranged in a row in a second direction running at right angles to the first direction,
the trenches are arranged in a row in the second direction.

15. A semiconductor storage arrangement according to claim 1, wherein an open bit-line concept,
secondary and tertiary word lines are arranged in two superimposed metallization planes, which word lines respectively run alternatively in the first metallization plane and in the second metallization plane,
in each case one secondary and one tertiary word line are arranged substantially one above the other in the first and second metallization planes, and above a primary word line, and are passed by one another without crossing when they alternate into the respectively other metallization plane,
the primary word line is divided into sections, each section being connected via a contact to the word line running above it in the first metallization plane.

16. The semiconductor storage arrangement according to claim 15, wherein in a region around the crossing-free alternation, the secondary and the tertiary word lines both run substantially in one of the two metallization planes, and a selection line is arranged in the other metallization plane.

* * * * *